US011984893B2

(12) United States Patent
Huang

(10) Patent No.: US 11,984,893 B2
(45) Date of Patent: May 14, 2024

(54) DATA RETENTION CIRCUIT AND METHOD

(71) Applicant: Nuvoton Technology Corporation, Hsinchu Science Park (TW)

(72) Inventor: Chi-Ray Huang, Kaohsiung (TW)

(73) Assignee: NUVOTON TECHNOLOGY CORPORATION, Hsinchu Science Park (TW)

( * ) Notice: Subject to any disclaimer, the term of this patent is extended or adjusted under 35 U.S.C. 154(b) by 0 days.

(21) Appl. No.: 17/994,227

(22) Filed: Nov. 25, 2022

(65) Prior Publication Data

US 2023/0208406 A1 Jun. 29, 2023

(30) Foreign Application Priority Data

Dec. 29, 2021 (TW) .................. 110149393

(51) Int. Cl.
*H03K 3/3562* (2006.01)
*H03K 3/037* (2006.01)
*H03K 3/356* (2006.01)

(52) U.S. Cl.
CPC ....... *H03K 3/35625* (2013.01); *H03K 3/0372* (2013.01); *H03K 3/356008* (2013.01)

(58) Field of Classification Search
CPC ............... H03K 3/0372; H03K 3/0375; H03K 3/356008; H03K 3/35625
See application file for complete search history.

(56) References Cited

U.S. PATENT DOCUMENTS

| 9,665,160 | B1 | 5/2017 | Cao et al. | |
|---|---|---|---|---|
| 2006/0267654 | A1* | 11/2006 | Gururajarao | H04W 52/0283 327/208 |
| 2008/0238510 | A1 | 10/2008 | Aksamit | |
| 2014/0075089 | A1 | 3/2014 | Bartling et al. | |
| 2017/0222630 | A1* | 8/2017 | Kim | H03K 3/35625 |
| 2023/0017888 | A1* | 1/2023 | Kong | H03K 19/20 |

FOREIGN PATENT DOCUMENTS

| CN | 101252349 B | 5/2011 |
|---|---|---|
| TW | I375884 B | 11/2012 |
| TW | I600278 B | 9/2017 |
| TW | 202131196 A | 8/2021 |

* cited by examiner

*Primary Examiner* — Patrick O'Neill
(74) *Attorney, Agent, or Firm* — MUNCY, GEISSLER, OLDS & LOWE, P.C.

(57) ABSTRACT

A data retention circuit is provided in the invention. The data retention circuit includes a master latch circuit, a slave latch circuit, and a control circuit. The control circuit is coupled to the master latch circuit and the slave latch circuit and receives a clock signal from a clock circuit and a power management signal from a power management unit (PMU). In a normal operation mode, the control circuit transmits the clock signal to the master latch circuit and the slave latch circuit. In sleep mode, power to the master latch circuit is switched off and the control circuit transmits the power management signal to the slave latch circuit.

6 Claims, 3 Drawing Sheets

DATA RETENTION CIRCUIT AND METHOD

CROSS REFERENCE TO RELATED APPLICATIONS

This application claims priority of TW Patent Application No. 110149393 filed on Dec. 29, 2021, the entirety of which is incorporated by reference herein.

BACKGROUND OF THE INVENTION

Field of the Invention

The invention generally relates to power gating technology, and more particularly, to a power gating technology in which when the system is in a sleep mode, the control circuit of the data retention circuit transmits the power management signal to the slave latch circuit of the data retention circuit to reserve the data.

Description of the Related Art

Power gating technology is widely used to reduce leakage current. When the system is in sleep mode, power provided to some circuits (i.e. power ON/OFF domain) will be switched off so that the leakage current in this power ON/OFF domain approaches 0. In addition, when the system is in sleep mode, other circuits (i.e. retention domain) which have power are used to store data and information that must not be lost. Therefore, the total leakage current of the system in sleep mode should be the leakage current in the power ON/OFF domain plus the leakage current in the retention domain. The leakage current in the retention domain is the main leakage current of the system in sleep mode.

Traditionally, in order to ensure that the system is able to rapidly perform the original operations before the system is switched from sleep mode to normal operation mode, a state retention flip-flop may be configured in the system to preserve the system information and data while in sleep mode. When the system enters sleep mode, power to the master latch of the state retention flip-flop will be switched off and power to the slave latch of the state retention flip-flop will not be switched off. Therefore, the slave latch may preserve the system information and data while in sleep mode. Traditionally, in order to ensure that the slave latch is able to latch the stored value (i.e. system information and data), the level of the clock signal of the state retention flip-flop will be maintained at a low level (e.g. 0). Therefore, in sleep mode, the clock circuit (e.g. a clock tree) of the system needs to be connected to a power source (i.e. the clock circuit needs to be configured in the retention domain) to maintain the level of the clock signal.

However, the clock circuit is designed to be performance oriented. Therefore, logic gates with a larger size and multi-threshold voltage technology may be used to design the clock circuit to meet the shortest timing requirements. Therefore, when the system enters sleep mode, the clock circuit may generate a larger leakage current, and as a result, power consumption increases due to the total leakage current in the system.

BRIEF SUMMARY OF THE INVENTION

A data retention circuit and method are provided to overcome the problems mentioned above.

An embodiment of the invention provides a data retention circuit. The data retention circuit includes a master latch circuit, a slave latch circuit, and a control circuit. The control circuit is coupled to the master latch circuit and the slave latch circuit and receives a clock signal from a clock circuit and a power management signal from a power management unit (PMU). In a normal operation mode, the control circuit transmits the clock signal to the master latch circuit and the slave latch circuit. In sleep mode, power to the master latch circuit is switched off and the control circuit transmits the power management signal to the slave latch circuit.

According to an embodiment of the invention, the master latch circuit and the clock circuit are configured in a power ON/OFF domain. In addition, according to an embodiment of the invention, the slave latch circuit is configured in a retention domain.

According to an embodiment of the invention, the control circuit comprises a first sub-circuit and a second sub-circuit, wherein the first sub-circuit is configured to control the second sub-circuit. When an input signal of the first sub-circuit is at a first level, the second sub-circuit transmits the clock signal to the master latch circuit and the slave latch circuit, and when the input signal of the first sub-circuit is at a second level, the second sub-circuit transmits the power management signal to the slave latch circuit.

An embodiment of the invention provides a data retention method. The data retention method is applied to a data retention circuit. The data retention circuit comprises a master latch circuit, a slave latch circuit, and a control circuit. The control circuit receives a clock signal from a clock circuit and a power management signal from a power management unit (PMU). The data retention method includes the following steps. In the normal operation mode, the control circuit transmits the clock signal to the master latch circuit and the slave latch circuit. In sleep mode, power to the master latch circuit is switched off and the control circuit transmits the power management signal to the slave latch circuit.

Other aspects and features of the invention will become apparent to those with ordinary skill in the art upon review of the following descriptions of specific embodiments of a data retention circuit and method.

BRIEF DESCRIPTION OF THE DRAWINGS

The invention will become more fully understood by referring to the following detailed description with reference to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 1:
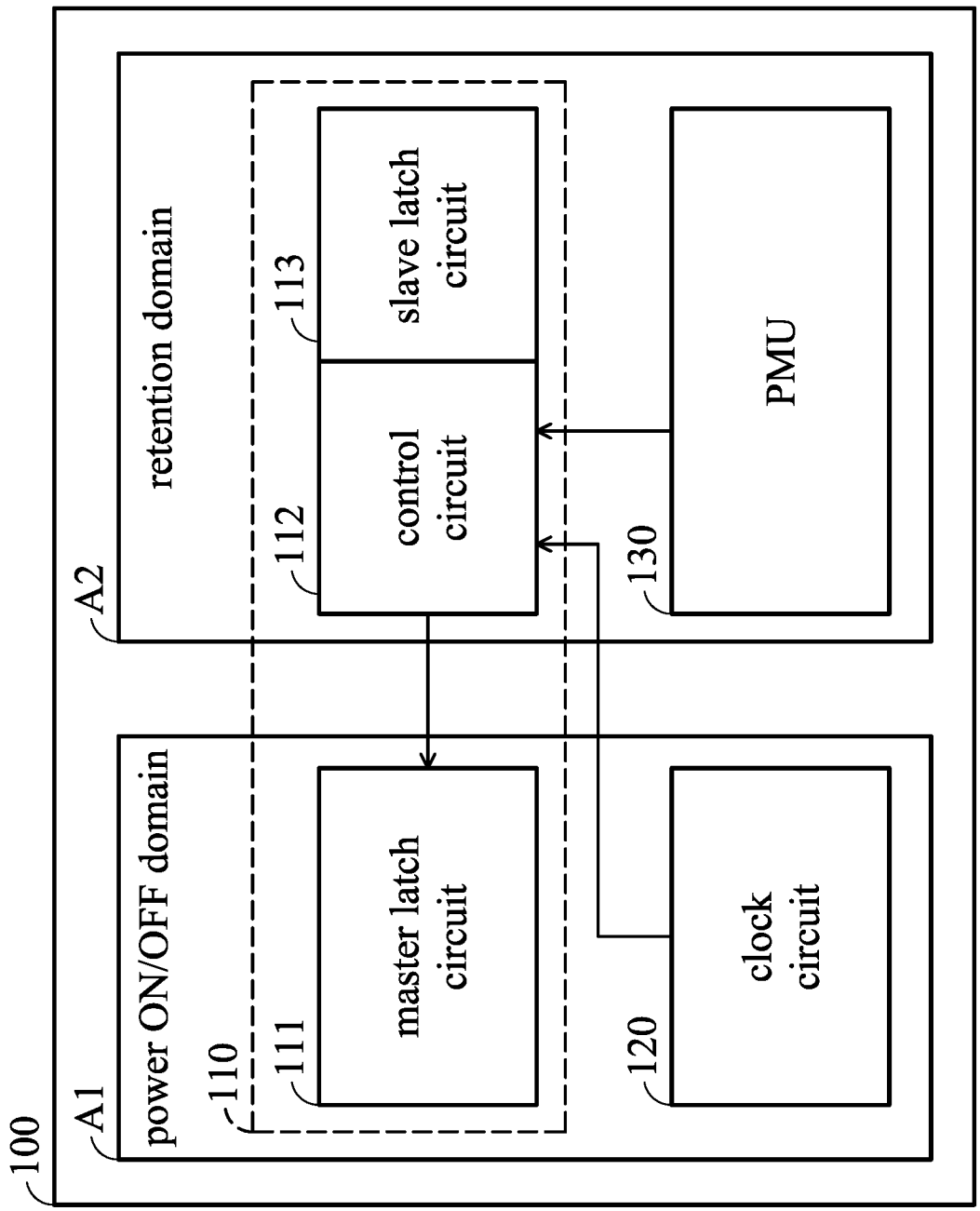
FIG. 1 is a block diagram of a power gating system 100 according to an embodiment of the invention.

FIG. 1 is a block diagram of a power gating system 100 according to an embodiment of the invention. As shown in FIG. 1, the power gating system 100 may comprise at least a data retention circuit 110, a clock circuit 120 and a power management unit (PMU) 130. It should be noted that FIG. 1 presents a simplified block diagram in which only the elements relevant to the invention are shown. However, the invention should not be limited to what is shown in FIG. 1. In addition, the power gating system 100 of the invention can be applied in the designs related to a power gating circuit.

According to the embodiments of the invention, the data retention circuit 110 may be a state retention flip-flop.

As shown in FIG. 1, the data retention circuit 110 may comprise a master latch circuit 111, a control circuit 112 and a slave latch circuit 113. In addition, as shown in FIG. 1, the master latch circuit 111 and the clock circuit 120 is configured in the power ON/OFF domain A1 of the power gating system 100 and the control circuit 112, the slave latch circuit 113 and the PMU 130 are configured in the retention domain (or always-on domain) A2 of the power gating system 100. In the embodiments of the invention, when the power gating system 100 is in a normal operation mode, the devices in the power ON/OFF domain A1 and the retention domain A2 may maintain normal operations. When the power gating system 100 is in a sleep mode, the power of the devices in the power ON/OFF domain A1 will be switched off (e.g. a switch circuit may be configured in the power gating system 100 to control the power provided to the devices in the power ON/OFF domain A, but the invention should not be limited thereto) and the devices in the retention domain A2 may maintain normal operations to reserve the data and system information.

According to an embodiment of the invention, the control circuit 112 may receive the clock signal from the clock circuit 120 and the power management signal from the PMU 130. In the embodiment, when the power gating system 100 is in the normal operation mode, the control circuit 112 may transmit the clock signal to the master latch circuit 111 and the slave latch circuit 113. In addition, when the power gating system 100 is in the sleep mode, the control circuit 112 may transmit the power management signal generated by the PMU 130 to the slave latch circuit 113. That is to say, in the embodiments of the invention, when the power gating system 100 is in the sleep mode, the operation of the slave latch circuit 113 is unrelated to the clock signal generated by the clock circuit 120. Therefore, the power management signal generated by the PMU 130 is a general signal. Therefore, compared to the clock signal, the power management signal has lower time requirement. Therefore, when the power gating system 100 is in the sleep mode, the leakage current for the power management signal used in the power gating system 100 may be lower than leakage current for the clock signal used in the power gating system 100.

According to an embodiment of the invention, the power management signal generated by the PMU 130 may be transmitted to the control circuit 112 through a buffer chain to maintain the completeness of the power management signal and avoid the attenuation of the power management signal in the long transmission path.

Because the clock signal received by the control circuit 112 from the clock circuit 120 is from the power ON/OFF domain A1, the voltage level of the clock signal may be random and unknown. Therefore, according to an embodiment of the invention, the control circuit may have an isolation cell function to avoid the wrong operations caused by the error signals and the large current caused by the short-circuit current.

Figure 2:
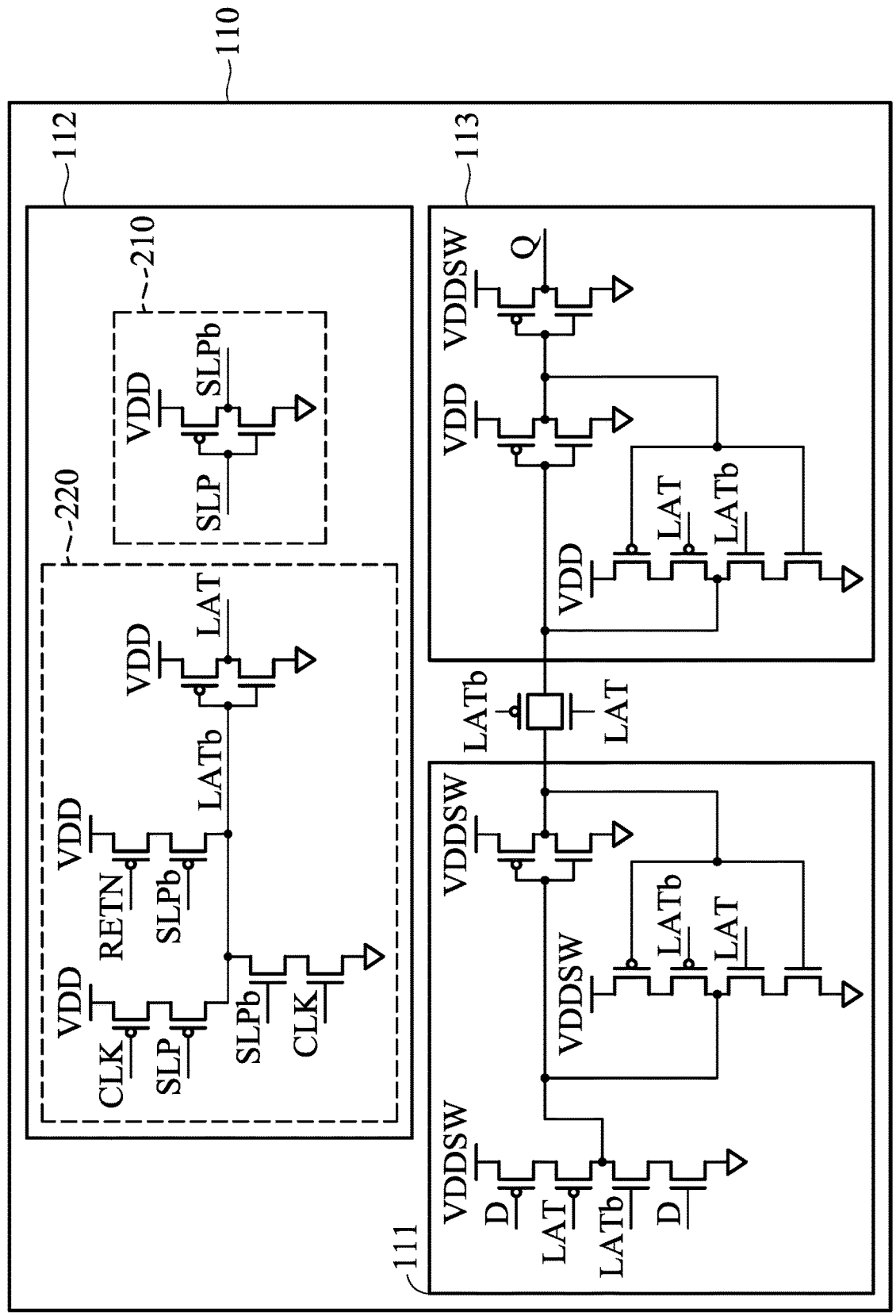
FIG. 2 is a circuit diagram illustrating a data retention circuit 110 according to an embodiment of the invention.

FIG. 2 is a circuit diagram illustrating a data retention circuit 110 according to an embodiment of the invention. As shown in FIG. 2, the control circuit 112 of the data retention circuit 110 may comprise a first sub-circuit 210 and a second sub-circuit 220. The first sub-circuit 210 may receive a first power management signal SLP from the PMU 130, and output a first inverse-power management signal SLPb. The second sub-circuit 220 may obtain the first power management signal SLP and the first inverse-power management signal SLPb from the first sub-circuit 210, obtain the clock signal CLK from the clock circuit 120 and receive a second power management signal RETN from the PMU 130. The second sub-circuit 220 may output the control signal LAT and the inverse control signal LATb to the master latch circuit 111 and the slave latch circuit 113. In addition, as shown in FIG. 2 the master latch circuit 111 may receive the power source VDDSW and the control circuit 112 and the slave latch circuit 113 may receive power source VDD. When the power gating system 100 is in the normal operation mode, the master latch circuit 111 in the power ON/OFF domain A1 and the control circuit 112 and the slave latch circuit 113 in the retention domain A2 may maintain normal operations (i.e. the power source VDDSW and the power source VDD may be provided to the devices normally). When the power gating system 100 is in the sleep mode, the power source VDDSW provided to the master latch circuit 111 in the power ON/OFF domain A1 will be switched off, but the power source VDD provided to the slave latch circuit 113 in the retention domain A2 will be provided to the slave latch circuit 113 normally to maintain the normal operation of the slave latch circuit 113 to reserve the data and system information. In addition, as shown in FIG. 2, the input data D may be the data-in signal of the data retention circuit 110 and the output signal Q may be the data-out signal of the data retention circuit 110.

When the power gating system 100 is in the normal operation mode, the input signal (i.e. the first power management signal SLP) of the first sub-circuit 210 may be a first level (e.g. low level), the first inverse-power management signal SLPb may be a second level (e.g. high level) and the second power management signal RETN may not affect the operation of the control circuit 112. That is to say, in the normal operation mode, the output the control signal LAT and the inverse control signal LATb outputted to the master latch circuit 111 and the slave latch circuit 113 by the second sub-circuit 220 may generated based on the clock signal CLK (i.e. in the normal operation mode, the control signal LAT and the inverse control signal LATb are the clock signals). The master latch circuit 111 and the slave latch circuit 113 may maintain normal operations based on the control signal LAT and the inverse control signal LATb.

When the power gating system 100 is in the sleep mode, the input signal (i.e. the first power management signal SLP) of the first sub-circuit 210 may be the second level (e.g. high level), the first inverse-power management signal SLPb may be the first level (e.g. low level) and the clock signal CLK may not affect the operation of the control circuit 112. That is to say, in the sleep mode, the output the control signal LAT and the inverse control signal LATb outputted to the slave latch circuit 113 by the second sub-circuit 220 may generated based on the second power management signal RETN (i.e. in the sleep mode, the control signal LAT and the inverse control signal LATb are the power management signals). The slave latch circuit 113 may reserve the data based on the control signal LAT and the inverse control signal LATb. It should be noted that the circuit diagram shown in FIG. 2 is only used to illustrate the embodiment of the invention, but the invention should not be limited thereto. The circuit equivalent to the circuit shown in FIG. 2 also can be applied to design the data retention circuit 110 of the invention.

Figure 3:
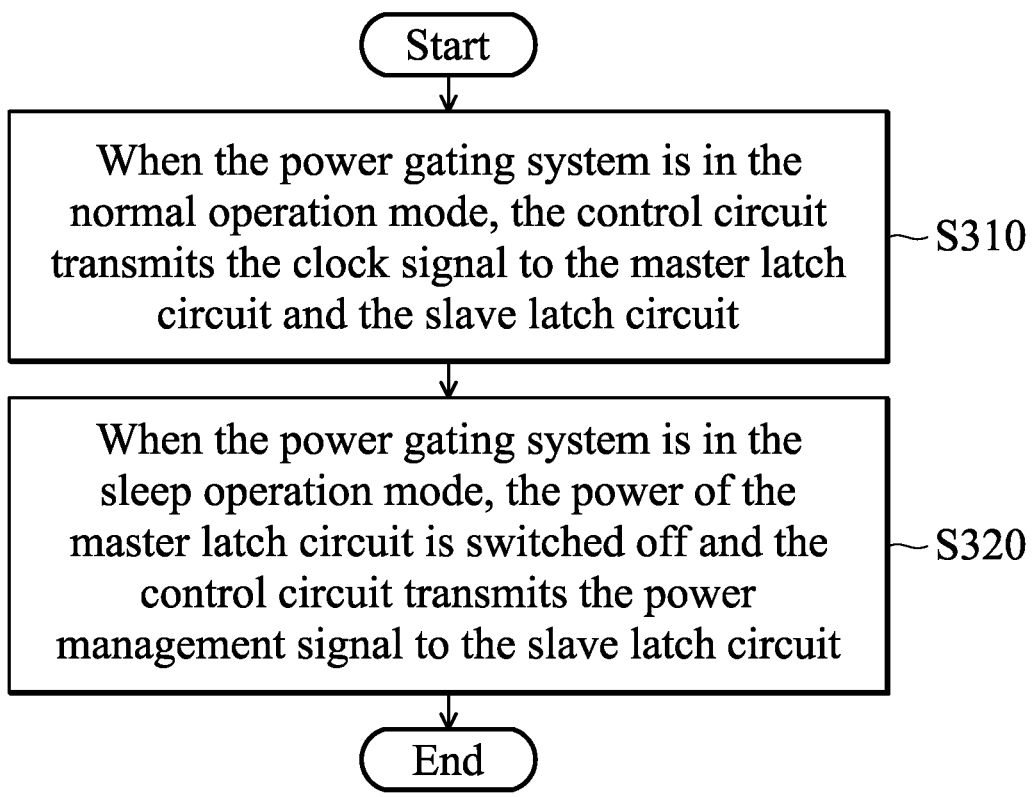
FIG. 3 is a flow chart illustrating a data retention method according to an embodiment of the invention.

FIG. 3 is a flow chart illustrating a data retention method according to an embodiment of the invention. The data retention method can be applied to the power gating system 100. As shown in FIG. 3, in step S310, when the power gating system 100 is in the normal operation mode, the control circuit of the data retention circuit 110 of the power gating system 100 transmits the clock signal from the clock circuit 120 of the power gating system 100 to the master latch circuit and the slave latch circuit of the data retention circuit 110.

In step S320, when the power gating system 100 is in the sleep operation mode, the power of the master latch circuit is switched off and the control circuit of the data retention circuit 110 transmits the power management signal from the power management unit 130 of the power gating system 100 to the slave latch circuit of the data retention circuit 110 to reserve the data.

According to an embodiment of the invention, in the data retention method, the master latch circuit of the data retention circuit 110 and the clock circuit 120 of the power gating system 100 are configured in the power ON/OFF domain of the power gating system 100.

According to an embodiment of the invention, in the data retention method, the slave latch circuit of the data retention circuit 110 and the power management unit 130 of the power gating system 100 are configured in the retention domain of the power gating system 100.

According to an embodiment of the invention, in the data retention method, the data retention circuit 110 may comprise a first sub-circuit and a second sub-circuit, wherein the first sub-circuit is configured to control the second sub-circuit. When an input signal of the first sub-circuit is at a first level, the second sub-circuit will transmit the clock signal to the master latch circuit and the slave latch circuit of the data retention circuit 110. When the input signal of the first sub-circuit is at a second level, the second sub-circuit will transmit the power management signal to the slave latch circuit of the data retention circuit 110.

According to the data retention method provided in the invention, when the power gating system is in the sleep mode, the clock signal generated by the clock circuit of the power gating system may not affect the operation of the slave latch circuit of the data retention circuit. Therefore, the clock circuit of the power gating system can be configured in the power ON/OFF domain to reduce the leakage current of the power gating system in the sleep mode.

Use of ordinal terms such as "first", "second", "third", etc., in the disclosure and claims is for description. It does not by itself connote any order or relationship.

The steps of the method described in connection with the aspects disclosed herein may be embodied directly in hardware, in a software module executed by a processor, or in a combination of the two. A software module (e.g., including executable instructions and related data) and other data may reside in a data memory such as RAM memory, flash memory, ROM memory, EPROM memory, EEPROM memory, registers, a hard disk, a removable disk, a CD-ROM, or any other form of computer-readable storage medium known in the art. A sample storage medium may be coupled to a machine such as, for example, a computer/processor (which may be referred to herein, for convenience, as a "processor") such that the processor can read information (e.g., code) from and write information to the storage medium. A sample storage medium may be integral to the processor. The processor and the storage medium may reside in an ASIC. The ASIC may reside in user equipment. Alternatively, the processor and the storage medium may reside as discrete components in user equipment. Moreover, in some aspects any suitable computer-program product may comprise a computer-readable medium comprising codes relating to one or more of the aspects of the disclosure. In some aspects a computer program product may comprise packaging materials.

The above paragraphs describe many aspects. Obviously, the teaching of the invention can be accomplished by many methods, and any specific configurations or functions in the disclosed embodiments only present a representative condition. Those who are skilled in this technology will understand that all of the disclosed aspects in the invention can be applied independently or be incorporated.

While the invention has been described by way of example and in terms of preferred embodiment, it should be understood that the invention is not limited thereto. Those who are skilled in this technology can still make various alterations and modifications without departing from the scope and spirit of this invention. Therefore, the scope of the present invention shall be defined and protected by the following claims and their equivalents.

What is claimed is:

1. A data retention circuit, comprising:
   a master latch circuit;
   a slave latch circuit; and
   a control circuit, coupled to the master latch circuit and the slave latch circuit and receiving a clock signal from a clock circuit and a power management signal from a power management unit (PMU);
   wherein in a normal operation mode, the control circuit transmits the clock signal to the master latch circuit and the slave latch circuit,
   wherein in a sleep mode, power to the master latch circuit is switched off and the control circuit transmits the power management signal to the slave latch circuit,
   wherein the control circuit comprises a first sub-circuit and a second sub-circuit, wherein the first sub-circuit is configured to control the second sub-circuit, and
   wherein when an input signal of the first sub-circuit is at a first level, the second sub-circuit transmits the clock signal to the master latch circuit and the slave latch circuit, and when the input signal of the first sub-circuit is at a second level, the second sub-circuit transmits the power management signal to the slave latch circuit.

2. The data retention circuit of claim 1, wherein the master latch circuit and the clock circuit are configured in a power ON/OFF domain.

3. The data retention circuit of claim 1, wherein the slave latch circuit is configured in a retention domain.

4. A data retention method, applied to a data retention circuit, wherein the data retention circuit comprises a master latch circuit, a slave latch circuit, and a control circuit, and wherein the control circuit receives a clock signal from a clock circuit and a power management signal from a power management unit (PMU), comprising:
   in a normal operation mode, transmitting, by the control circuit, the clock signal to the master latch circuit and the slave latch circuit; and
   in a sleep mode, switching off a power to the master latch circuit and transmitting, by the control circuit, the power management signal to the slave latch circuit,
   wherein the control circuit comprises a first sub-circuit and a second sub-circuit, wherein the first sub-circuit is configured to control the second sub-circuit, and wherein the method further comprises:
when an input signal of the first sub-circuit is at a first level, transmitting, by the second sub-circuit, the clock signal to the master latch circuit and the slave latch circuit; and
when the input signal of the first sub-circuit is at a second level, transmitting, by the second sub-circuit, the power management signal to the slave latch circuit.

5. The data retention method of claim 4, wherein the master latch circuit and the clock circuit are configured in a power ON/OFF domain.

6. The data retention method of claim 4, wherein the slave latch circuit is configured in a retention domain.

* * * * *